US006563352B1

(12) United States Patent
Gohel et al.

(10) Patent No.: US 6,563,352 B1
(45) Date of Patent: May 13, 2003

(54) DRIVER CIRCUIT EMPLOYING HIGH-SPEED TRI-STATE FOR AUTOMATIC TEST EQUIPMENT

(75) Inventors: Tushar K. Gohel, Malden, MA (US); Richard P. Davis, Billerica, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/113,179

(22) Filed: Mar. 29, 2002

(51) Int. Cl.[7] .............................................. H03K 3/00
(52) U.S. Cl. ......................... 327/108; 327/109; 326/56; 326/57
(58) Field of Search .............................. 326/56, 57, 58, 326/82, 83, 85, 87, 86, 90, 91, 80; 327/108, 109, 112

(56) References Cited

U.S. PATENT DOCUMENTS 6,177,836 B1 * 1/2001 Young et al. ................. 330/43
6,355,637 B1 * 1/2002 Correal, Jr. et al. .......... 326/80
6,400,177 B1 * 6/2002 Yoshizaki ..................... 326/30

* cited by examiner

Primary Examiner—Tuan T. Lam
Assistant Examiner—Hiep Nguyen
(74) Attorney, Agent, or Firm—Bruce D. Rubenstein

(57) ABSTRACT

A driver circuit suitable for use in automatic test equipment includes a driver input for receiving an input signal and a driver output for producing an output signal. The driver input is coupled to respective inputs of first and second amplifiers. The first amplifier has an output that can substantially source current only, and the second amplifier has an output that can substantially sink current only. The outputs of the first and second amplifiers are coupled to the driver output, for producing the driver output signal. The driver circuit further includes a disable circuit having an input for receiving a drive disable signal and at least one output coupled to the first and second amplifiers. The driver circuit is constructed and arranged so that the disable circuit drives the first amplifier low and the second amplifier high in response to an activation of the drive disable signal. These actions cut off output current and effectively tristate the driver circuit. In response to a deactivation of the drive disable signal, the first and second amplifiers are restored to their normal operating modes.

24 Claims, 3 Drawing Sheets

6,563,352 B1

DRIVER CIRCUIT EMPLOYING HIGH-SPEED TRI-STATE FOR AUTOMATIC TEST EQUIPMENT

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to driver circuits, and, more particularly, to driver circuits having tristatable outputs that are suitable for use in automatic test equipment.

2. Description of Related Art Including Information Disclosed Under 37 C.F.R. 1.97 AND 1.98

Automatic test equipment (ATE) plays a significant role in the manufacture of semiconductor devices and circuit board assemblies. Manufacturers generally use automatic test equipment, or "testers," to verify the operation of electronic units during the manufacturing process. Early detection of faults eliminates costs that would otherwise be incurred by processing defective units, and thus reduces the overall costs of manufacturing. Manufacturers also use ATE to grade various specifications. Units can be tested and binned according to different levels of performance in significant areas, for example, speed. Units can then be labeled and sold according to their actual levels of performance.

The instant invention relates to driver circuits for ATE. Testers employ driver circuits for many uses. Perhaps the most prevalent use is for stimulating devices under test (DUTs) during the execution of test processes. Stimuli from driver circuits can be provided in the form of analog or digital signals, and can cover a potentially wide range of voltages. In addition, stimuli can be subject to precise timing control.

In addition to supporting an ON mode, in which a driver's output signal varies in proportion to its input signal, driver circuits for ATE generally also support a "tristate" mode. In tristate, a driver's output impedance goes to a high value and consequently its output current goes substantially to zero. Most test procedures require that driver circuits switch between ON mode and tristate mode at high speed, and at precisely controlled instants in time. For ATE applications, therefore, driver circuits should be able to switch quickly between ON mode to tristate mode.

BRIEF SUMMARY OF THE INVENTION

With the foregoing background in mind, it is an object of the invention for a driver circuit to turn off and on quickly.

To achieve the foregoing object, as well as other objectives and advantages, a driver circuit includes a driver input for receiving an input signal and a driver output for producing an output signal. The driver input is coupled to respective inputs of first and second amplifiers. The first amplifier has an output configured for substantially sourcing current only, and the second amplifier has an output configured for substantially sinking current only. The outputs of the first and second amplifiers are coupled to the driver output, for producing the driver output signal. The driver circuit further includes a disable circuit having an input for receiving a drive disable signal (DD) and at least one output coupled to the first and second amplifiers. The driver circuit is constructed and arranged to drive the first and second amplifiers, in response to the DD signal, to levels that substantially cut off output current and tristate the driver circuit.

BRIEF DESCRIPTION OF THE SEVERAL VIEWS OF THE DRAWINGS

Additional objects, advantages, and novel features of the invention will become apparent from a consideration of the ensuing description and drawing, in which.

DETAILED DESCRIPTION OF THE INVENTION

Figure 1:
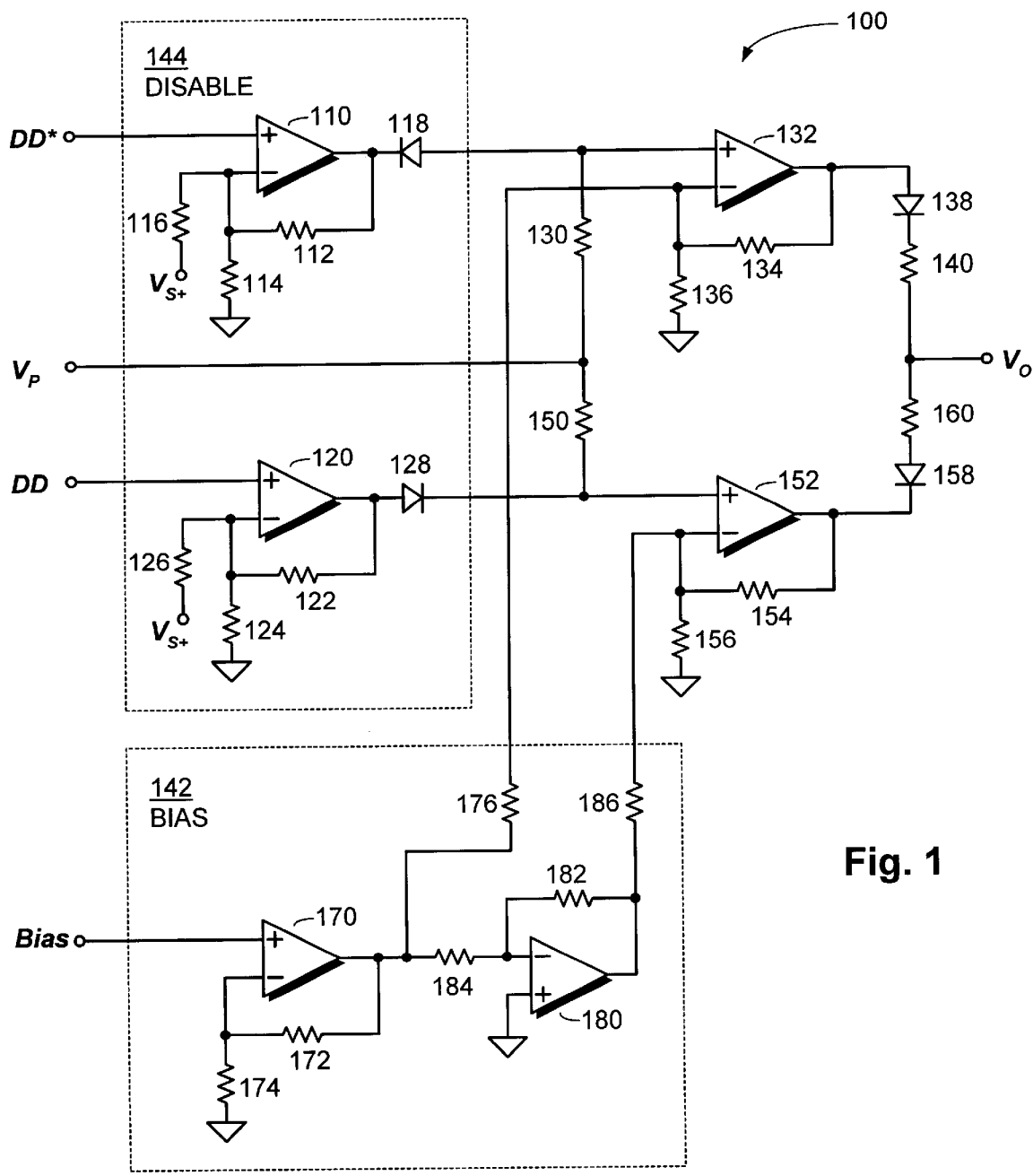
FIG. 1 is a simplified schematic of a driver circuit according to the preferred embodiment of the invention.

FIG. 1 shows an embodiment of a driver circuit 100 in accordance with the invention. The driver circuit 100 has an input $V_P$ and an output $V_O$. The input $V_P$ is coupled via an impedance 130 to a first input of a first amplifier 132, and via an impedance 150 to a first input of a second amplifier 152. The first amplifier 132 has an output arranged to conduct output current to $V_O$ substantially in a sourcing direction only. The second amplifier 152 has an output arranged to conduct output current to $V_O$ substantially in the sinking direction only. In the illustrative embodiment of FIG. 1, diodes 138 and 158 ensure this substantially one-way conduction. Amplifiers 132 and 152 are preferably operational amplifiers (op amps), and impedances 130 and 150 are preferably resistors.

The first and second amplifiers 132 and 152 preferably employ negative feedback to control their respective outputs. In the illustrative embodiment of FIG. 1, the first and second amplifiers are each configured with non-inverting closed loop gain. In the preferred embodiment, these gains are substantially identical and are set to approximately +1.6. A negative offset voltage, originating from a bias circuit 142, preferably biases the output of the first amplifier 132 in the positive direction. A positive offset voltage, also originating from the bias circuit, preferably biases the output of the second amplifier 152 the negative direction. Consequently, the output of the first amplifier 132 is normally more positive than the output of the second amplifier 152.

At least one impedance is disposed between the outputs of the first and second amplifiers to establish an output bias current. Preferably, two substantially identical impedances are used, for example, resistors 140 and 160, so that $V_O$ is established substantially at the midpoint of the outputs of the first and second amplifiers. This is not critical, however. Preferably, the resistors 140 and 160 have small values (e.g., one or two ohms), to keep output impedance of the driver circuit 100 low during low impedance mode.

With this arrangement, $V_O$ varies linearly with $V_P$ and has predetermined gain and offset. Input swings of $V_P$ between +/−8 Volts are converted to output swings between +/−13 Volts. When used as a digital driver circuit, $V_P$ generally alternates between two voltage levels, under control of a test system's timing generator (not shown). This causes $V_O$ to vary between corresponding voltage levels (VIL and VIH), to digitally stimulate the input of a DUT. Alternatively, $V_O$ can be made to vary between greater than two discrete levels, in response to greater than two input levels of $V_P$. When used as a digital driver circuit, $V_O$ can be made to vary over a substantially continuous range of values.

As shown in FIG. 1, the driver circuit 100 also includes a disable circuit 144. The disable circuit 144 selectively tristates the driver's output upon activation of a Drive Disable (DD) signal. The DD signal generally originates from the timing generator of the test system and is subject to precise timing control. In the illustrative embodiment of FIG. 1, DD is a differential signal, wherein DD* is fed to a first input of an amplifier 110, and DD is fed to a first input of an amplifier 120.

Preferably, the amplifiers 110 and 120 are each arranged with negative feedback and a non-inverting gain of approximately 5. In the illustrative embodiment of FIG. 1, DD and DD* are provided with 3.3 Volt logic. The amplifiers 110 and 120 are negatively offset via connection of a positive supply (or other reference) through impedances 116 and 126 to respective non-inverting inputs of the amplifiers. The combination of this offset and the amplifier's closed loop gain causes the respective outputs to swing between −9 Volts and +9 Volts in response to swings of DD and DD* between 0 and 3.3 Volts.

The output of the amplifier 110 is coupled to the non-inverting input of the first amplifier 132 via a substantially unidirectionally conductive device, for example, a diode 118. The diode 118 is arranged so that the amplifier 110 can substantially sink current only from the input of the amplifier 132. In a similar fashion, the output of the amplifier 120 is coupled to the non-inverting input of the second amplifier 152 via another substantially unidirectionally conductive device, for example, diode 128. The diode 128 is arranged so that the amplifier 120 can substantially source current only to the input of the amplifier 152. When DD is false, the output of amplifier 110 is at about +9 Volts and the output of amplifier 120 is at about −9 Volts. Since $V_P$ is in the range between +/−8 Volts, diodes 118 and 128 both substantially block current flow, causing the disable circuit 144 to have substantially no effect on the driver circuit 100. When DD is true, however, the outputs of the amplifiers 110 and 120 switch polarity and tristate the driver circuit 100. In particular, the output of the amplifier 110 goes to −9 Volts and the output of the amplifier 120 goes to +9 Volts. The diodes 118 and 128 both become conductive in their respective forward directions. Consequently, the first input of first amplifier 132 is pulled down and the first input of second amplifier 152 is pulled up. This transition reverses the normal condition of the first and second amplifiers by causing the output voltage of the second amplifier to exceed the output voltage of the first amplifier. As a result, output diodes 138 and 158 become reverse-biased. Consequently, the driver circuit 100 becomes tristated. When the DD signal once again goes false, the output of amplifier 110 goes to +9 Volts and the output of the amplifier 120 goes to −9 Volts. Diodes 118 and 128 become reverse biased, substantially blocking current flow and allowing the driver circuit 100 to be restored to its normal operating condition.

A significant feature of the driver circuit 100 is that the first and second amplifiers 132 and 152 are operated with feedback, and the feedback remains intact during both ON mode and tristate mode. This means that the output of each amplifier equals its respective input voltage times the amplifier's closed-loop gain, for both modes. The respective outputs can be either increased or decreased to satisfy feedback conditions. The advantage of maintaining feedback control is that the amplifiers 132 and 152 continue to operate at their specified bandwidth and slew rate. If the amplifiers were instead configured to lose feedback control in tristate mode, for example, by saturating, the amplifiers would likely operate much more slowly than their bandwidth and slew rate specifications indicate, causing performance to be impaired.

Preferably, the amplifiers 110 and 120 of the disable circuit 144 also maintain feedback control for both states of the DD signal. Therefore, the speed of the disable circuit 144 is predictable as well.

In the preferred embodiment, the first and second amplifiers 132 and 152 are implemented with THS3125 current feedback operational amplifiers, which are available from Texas Instruments, Inc., of Dallas, Tex. The THS3125 operates at 128 MHz and has a slew rate of 1550 V/µs. It can supply 26 Volt output swings and 450 mA of output current. The THS3125 is available as a dual device, which means that both amplifiers 132 and 152 can be provided in a single package. The amplifiers 110 and 120 are preferably THS3001 current feedback operational amplifiers, also available from Texas Instruments. The THS3001 has a bandwidth of 420 MHz and a slew rate of 6550 V/µs. Of course, different amplifiers could be used in place of the THS3125 and THS3001, as the requirements of the driver circuit allow.

To promote high speed operation, diodes 118 and 128 are preferably Schottky diodes. To meet the reverse voltage and forward current requirements of the output stage, output diodes 138 and 158 are preferably conventional P-N diodes. Schottky diodes could alternatively be used for the output diodes for lower current and/or lower voltage applications. Schottky diodes could also be connected in series to provide higher effective reverse breakdown voltage, but at the expense of output voltage range.

The driver circuit 100 combines high-speed components with a topology that maintains feedback in both ON and tristate mode. These features enable the driver circuit to both enter and exit tristate mode at exceedingly high speed. Because the driver circuit 100 is preferably implemented using integrated circuits (i.e., op amps), it also has the benefit of being relatively simple for an ATE company to manufacture.

Alternatives

Having described one embodiment, numerous alternative embodiments or variations can be made. For instance, the preferred embodiment calls for the use of 10 diodes 118, 128, 138, and 158 as unidirectional current devices. Other types of devices can be used, however, such as bipolar junction transistors (BJTs), field effect transistors (FETs), or optically coupled variable resistance devices.

As described above, unidirectional current devices are provided externally to the first and second amplifiers 132 and 152 via diodes. But the unidirectional current devices can alternatively be provided internally to the amplifiers . For example, the output stage of the first amplifier 132 can be arranged to source current only (e.g., using NPN transistors only), and the output stage of the second amplifier 152 can be arranged to sink current only (e.g., using PNP transistors only).

In the preferred embodiment, amplifiers 132 and 152 are current-mode op amps. This is not required, however. Alternatively, they could be implemented using conventional voltage mode op amps or discrete transistor circuits configured as amplifiers.

As shown and described herein, the disable circuit 144 is constructed with amplifiers 110 and 120 that employ negative feedback. This topology has the advantage that it maintains feedback control during both ON mode and tristate mode, and thus promotes high speed. It is not a required element of the invention, however. Alternatively, the disable circuit 144 can be constructed with amplifiers that operate open loop. These amplifiers can be constructed in any suitable way, for instance, using op amps, gates, or discrete transistors. The disable circuit can take a wide variety forms.

Figure 3:
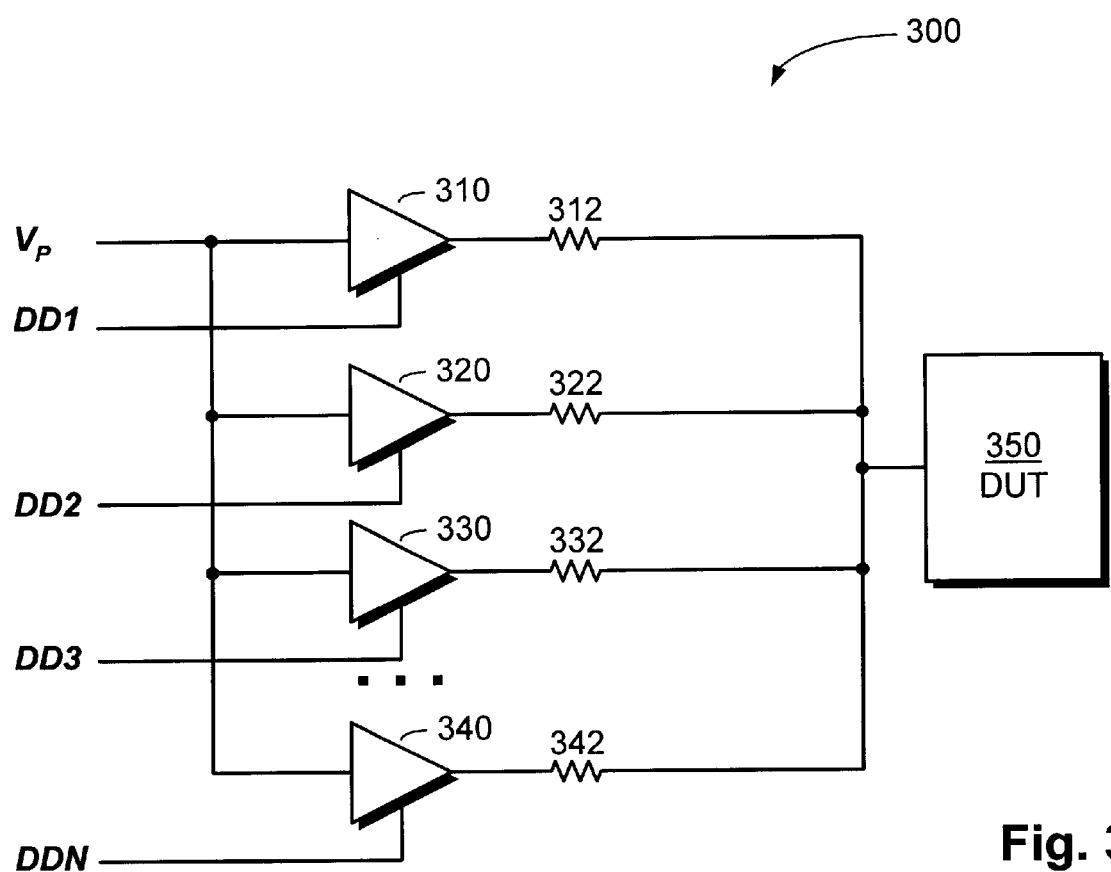
FIG. 3 is a simplified schematic of a parallel connection of driver circuits that provides variable output impedance.

As described herein, driver circuits are provided for individually driving different nodes of a DUT. However, they can also be connected in parallel for driving the same node. For instance, four driver circuits (310, 320, 330, and 340) can each be connected to the same node of the DUT through respective 100-ohm resistors (See FIG. 3). The combined circuit can then produce output impedances of 25-ohms, 33.3-ohms, 50-ohms, 100-ohms, or tristate (off), by turning on four, three, two, one, or none of the individual driver circuits 100, respectively. Any number of driver circuits can be connected this way. The output resistors can be provided with the same value or different values. Because each driver circuit 100 can individually switch between ON mode and tristate mode at high speed, the parallel connection of driver circuits can be made to switch output impedance at similarly high speed.

The driver circuit 100 may be used for other purposes besides supplying stimuli to a DUT. For example, the driver circuit can be used to terminate signals originating from the DUT. According to one approach, a plurality of driver circuits 100 are connected to the same node of the DUT through different value output resistors (also shown in FIG. 3). Termination is accomplished by selecting a desired output resistor, and tristating each driver circuit except the one connected to the DUT through the selected output resistor. The driver circuit is then programmed to the desired termination voltage. Alternatively, the output resistors can all have the same value and combinations of driver circuits can be selectively turned on and off to achieve the desired termination impedance.

Figure 2:
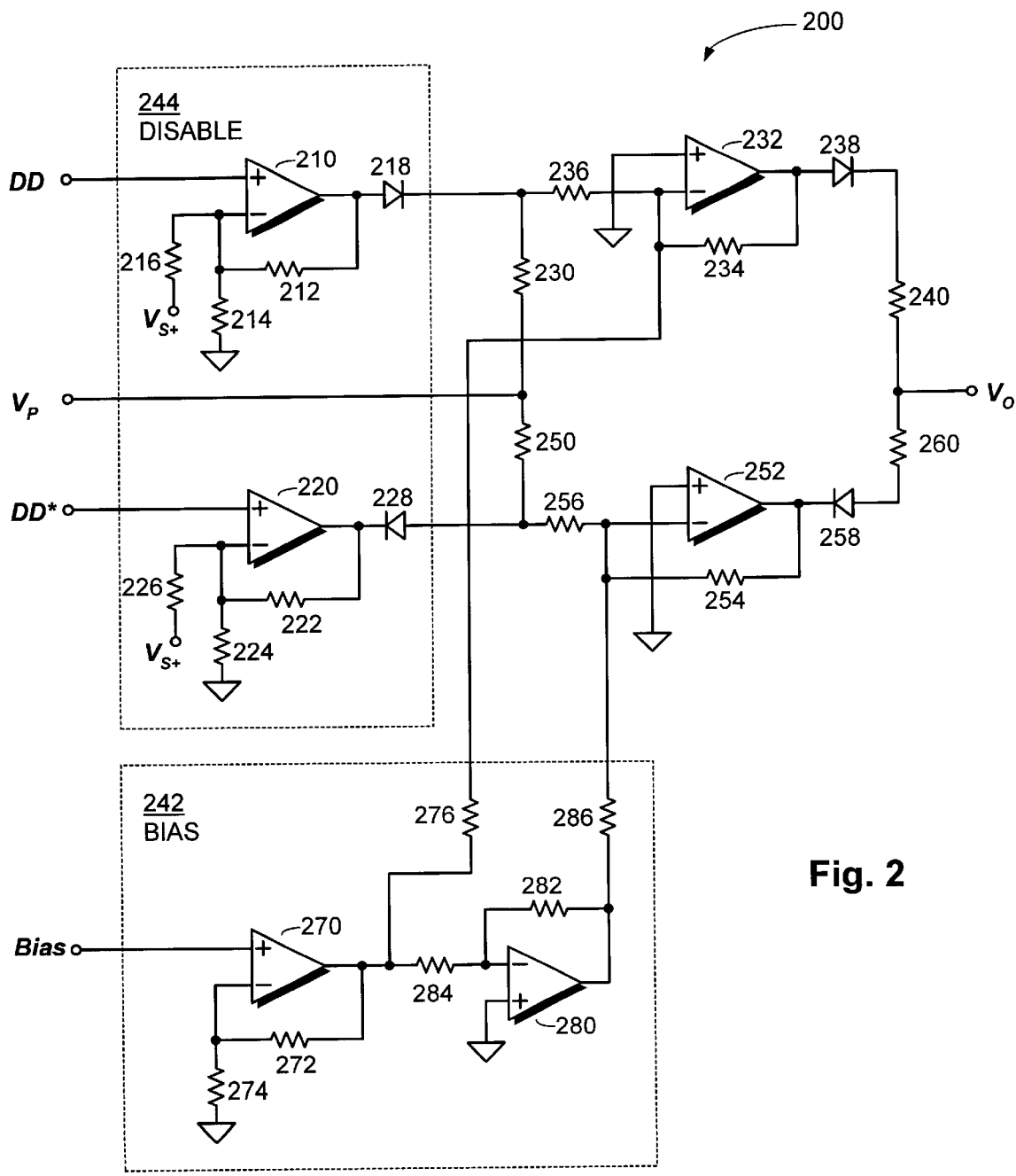
FIG. 2 is a simplified schematic of the driver circuit according to an alternative embodiment of the invention.

As is pictured and described, the first and second amplifiers 132 and 152 are configured with a non-inverting gain of approximately 1.6. Other values of gain can be used, however, as circumstances require. With corresponding adjustments elsewhere in the circuit, the amplifiers 132 and 152 could alternatively be provided with inverting gain. FIG. 2 shows an example of this alternative. The disable amplifiers (110, 120, or 210, 220) could also be provided with inverting gain (not shown), provided that corresponding changes are made to account for the resulting changes in polarity.

As pictured and described, the DD signal is a differential signal that is fed to separate amplifiers (110, 120, or 210, 220), which control separate driver amplifiers (132, 152, or 232, 252). This arrangement can be varied significantly. For instance, the DD signal can be provided as a single-ended signal rather than a differential signal. A single amplifier can condition this single-ended signal, if required, to provide a single output. The output of this amplifier could then be passed through a unidirectional current device, such as a diode, to an input of each of the first and second amplifiers (132, 152, or 232, 252). This single signal can be made to move the outputs of the first and second amplifiers in opposite directions, by coupling the signal to the non-inverting input of one of the amplifiers and to the inverting input of the other. As yet another variation, the DD signal could be provided in its complementary form, as a drive enable signal (DE).

In both of the pictured embodiments, the outputs of the first and second amplifiers (132, 152, or 232, 252) are subject to DC offsets that bias their outputs above and below $V_O$. There are many ways of establishing offset voltages, all of which are intended to fall within the scope of the invention.

As shown and described, a bias current is established at the output of the driver circuit 100 by offsetting the first and second amplifiers 132 and 152. Preferably, the first amplifier 132 is offset positively and the second amplifier is offset negatively. It is not strictly necessary that both amplifiers be offset, however. For instance, the first amplifier could be offset positively, while the second amplifier is not offset at all. Alternatively, the second amplifier could be offset negatively, while the first amplifier is not offset at all. In fact, any desired arrangements of offsets can be applied, as long as the output of the first amplifier exceeds the output of the second amplifier by enough to provide output conduction, and the output bias current is not excessive.

The degree by which the output voltages of the first and second amplifiers differ can also be varied. For instance, when driving high impedance loads, the voltage difference between the outputs of the first and second amplifiers can be made small to provide low output bias current. For driving lower impedance loads, the voltage difference can be increased. According to one variation, the Bias signal feeding the bias circuit 142 is made variable for accommodating different expected load conditions. The Bias signal is set to a relatively low value (in terms of absolute value) when the driver circuit is expected to supply low output current, and to a relatively high value when the driver circuit is expected to supply high output current.

During high impedance mode, the first amplifier 132, 232 is preferably driven lower than the lowest allowable level of $V_O$, and the second amplifier 152, 252 is preferably driven higher than the highest allowable level of $V_O$. Alternative embodiments need not drive the amplifiers all the way to these out-of-range levels. High impedance can be effectively established whenever the output levels of the first and second amplifiers prevent forward conduction of the output diodes.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A driver circuit, comprising:
    a driver input for receiving an input signal;
    a driver output for producing an output signal;
    a first amplifier having an input coupled to the driver input and an output coupled to the driver output and arranged for substantially sourcing current only;
    a second amplifier having an input coupled to the driver input and an output coupled to the driver output and arranged for substantially sinking current only; and
    a disable circuit having an input for receiving at least one drive disable signal and at least one output coupled to the first and second amplifiers,
    wherein the disable circuit is constructed and arranged to drive at least one of the first and second amplifiers so that the output of the first amplifier is lower than the output of the second amplifier.

2. A driver circuit as recited in claim 1, wherein the first and second amplifiers employ negative feedback to control their respective output voltages, and maintain feedback regulation for both active and inactive states of the drive disable signal.

3. A driver circuit as recited in claim 2, wherein the first and second amplifiers each comprise an operational amplifier.

4. A driver circuit as recited in claim 3, wherein the operational amplifier is a current-mode operational amplifier.

5. A driver circuit as recited in claim 1, wherein the disable circuit is constructed and arranged to drive the first amplifier low and the second amplifier high in response to an activation of the at least one drive disable signal, thereby effectively tristating the driver circuit.

6. A driver circuit as recited in claim 1, further comprising a first offsetting circuit coupled to the first amplifier for establishing an offset voltage of the first amplifier.

7. A driver circuit as recited in claim 6, further comprising a second offsetting circuit coupled to the second amplifier for establishing an offset voltage of the second amplifier.

8. A driver circuit as recited in claim 7, wherein the offset voltage of the first amplifier is more positive than the offset voltage of the second amplifier.

9. A driver circuit as recited in claim 1, further comprising:
   a first unidirectional current device coupled in series with the output of the first driver circuit and allowing current conduction from the output of the first amplifier to the driver output; and
   a second unidirectional current device coupled in series with the output of the second driver circuit and allowing current conduction from the driver output to the output of the first amplifier.

10. A driver circuit as recited in claim 9, wherein the first and second unidirectional current devices are diodes.

11. A driver circuit as recited in claim 9, further comprising at least one impedance coupled in series between the output of the first amplifier and the output of the second amplifier for establishing an output bias current of the driver circuit.

12. A driver circuit as recited in claim 1, wherein
   the driver input is coupled to the inputs of the first and second amplifiers via respective impedances,
   the disable circuit is coupled to the input of the first amplifier via a first device arranged for substantially sinking current only from the input of the first amplifier, and
   the disable circuit is coupled to the input of the second amplifier via a second device arranged for substantially sourcing current into the input of the second amplifier.

13. A driver circuit as recited in claim 12, wherein the disable circuit comprises:
   a first disable amplifier having an input for receiving the drive disable signal and having an output coupled to the first device; and
   a second disable amplifier having an input for receiving a compliment of the drive disable signal and having an output coupled to the second device.

14. A driver circuit as recited in claim 13, wherein the first and second disable amplifiers employ negative feedback to control their respective output voltages, and maintain feedback regulation for both active and inactive states of the drive disable signal.

15. A driver circuit, comprising:
   a driver input for receiving an input signal;
   a driver output for producing an output signal;
   a first amplifier having a plurality of inputs, one of said inputs being coupled to the driver input, and an output coupled to the driver output and configured for substantially sourcing current only;
   a second amplifier having a plurality of inputs, one of said inputs being coupled to the driver input, and an output coupled to the driver output and configured for substantially sinking current only; and
   means for disabling the driver circuit, having an input for receiving a drive disable signal, a first output coupled to at least one of the plurality of inputs of the first amplifier, and a second output coupled to at least one of the plurality of inputs of the second amplifier,
   wherein the means for disabling the driver circuit includes means, responsive to the activation of a drive disable signal, for driving the outputs of the first and second amplifiers so that the output of the first amplifier is lower than the output of the second amplifier.

16. A driver circuit as recited in claim 15, wherein the first and second amplifiers employ negative feedback to control their respective output voltages, and maintain feedback regulation for both active and inactive states of the drive disable signal.

17. A driver circuit as recited in claim 15, wherein the means for disabling the driver circuit employs negative feedback to control its outputs and maintains feedback regulation for both active and inactive states of the drive disable signal.

18. A method of generating an output signal from an input signal for stimulating a device under test (DUT) in an automatic test system, comprising:
   generating a first voltage proportional to the input signal, from a first circuit that can substantially source current only;
   generating a second voltage proportional to the input signal, from a second circuit that can substantially sink current only;
   combining the first and second voltages via at least one impedance to produce the output signal, wherein the first voltage is normally greater than the second voltage; and
   driving, in response to the assertion of a drive disable signal, at least one of the first and second circuits to cause the second voltage to exceed the first voltage, thereby causing the output signal to assume a high impedance state.

19. A method as recited in claim 18, wherein the steps of generating are each accomplished via an amplifier operating with negative feedback, and feedback regulation is maintained during the generating step as well as during the driving step.

20. A method as recited in claim 18, wherein the method is used as part of a test process for testing electronic devices.

21. A circuit for generating a signal for testing a device, comprising:
   an input for receiving an input signal;
   an output for producing an output signal;
   a plurality of driver circuits, each including:
      a driver input;
      a driver output;
      a first amplifier having an input coupled to the driver input and an output coupled to the driver output and arranged for substantially sourcing current only;

a second amplifier having an input coupled to the driver input and an output coupled to the driver output and arranged for substantially sinking current only; and a disable circuit having an input for receiving at least one drive disable signal and at least one output coupled to the first and second amplifiers, wherein the disable circuit is constructed and arranged to drive at least one of the first and second amplifiers so that the output of the first amplifier is lower than the output of the second amplifier; and a plurality of output impedances, each having a first node coupled to a different driver output of the plurality of driver circuits and a second node coupled to the second node of each of the other of the plurality of output impedances.

22. A circuit as recited in claim 21, wherein the signal for testing the device is a termination level for terminating a signal that originates at the device.

23. A circuit as recited in claim 21, wherein the signal for testing the device is a drive signal for providing a stimulus to the device.

24. A driver circuit, comprising:

a driver input for receiving an input signal;

a driver output for producing an output signal;

a first amplifier having an input coupled to the driver input and an output coupled to the driver output and arranged for substantially sourcing current only; and a second amplifier having an input coupled to the driver input and an output coupled to the driver output and arranged for substantially sinking current only, wherein the driver circuit is constructed and arranged to drive, responsive to the assertion of at least one drive disable signal, at least one of the first and second amplifiers so that the output of the first amplifier is lower than the output of the second amplifier.

* * * * *